United States Patent [19]

Schulze-Kahleyss

[11] Patent Number: 4,846,347

[45] Date of Patent: Jul. 11, 1989

[54] ARRANGEMENT FOR SUPPLYING INTEGRATED COMPONENTS TO AN AUTOMATIC INSERTION MACHINE FOR PRINTED CIRCUIT BOARDS

[75] Inventor: Rainer Schulze-Kahleyss, Erlangen, Fed. Rep. of Germany

[73] Assignee: Siemens Aktiengesellschaft, Berlin and Munich, Fed. Rep. of Germany

[21] Appl. No.: 163,483

[22] Filed: Mar. 3, 1988

[30] Foreign Application Priority Data

Mar. 25, 1987 [DE] Fed. Rep. of Germany ....... 8704390

[51] Int. Cl.⁴ ............................................. B65D 73/02
[52] U.S. Cl. .................................. 206/332; 206/334; 206/444; 220/23.4
[58] Field of Search ............... 220/23.4; 206/444, 328, 206/332, 334

[56] References Cited

U.S. PATENT DOCUMENTS

| Re. 29,683 | 6/1978 | Ocken, Jr. | 220/23.4 |
| 4,015,707 | 4/1977 | Kisor | 206/328 |
| 4,583,640 | 4/1986 | Gillam | 206/328 |
| 4,635,794 | 1/1987 | Lemmer | 206/328 |
| 4,765,469 | 8/1988 | Seifert | 206/444 |

FOREIGN PATENT DOCUMENTS 0134911  4/1986  Fed. Rep. of Germany .

Primary Examiner—Joseph Man-Fu Moy
Attorney, Agent, or Firm—Lawrence C. Edelman

[57] ABSTRACT

IC's are usually introduced into an automatic insertion machine stacked in stick-like magazines and inserted via a laterally slideable carrier device. According to the invention, a coupling element is provided with which the stick-like magazines, while stacked in the carrier device, are coupleable with an additional set of stick magazines. The insertion capacity of the machine is increased thereby by 100%.

2 Claims, 2 Drawing Sheets

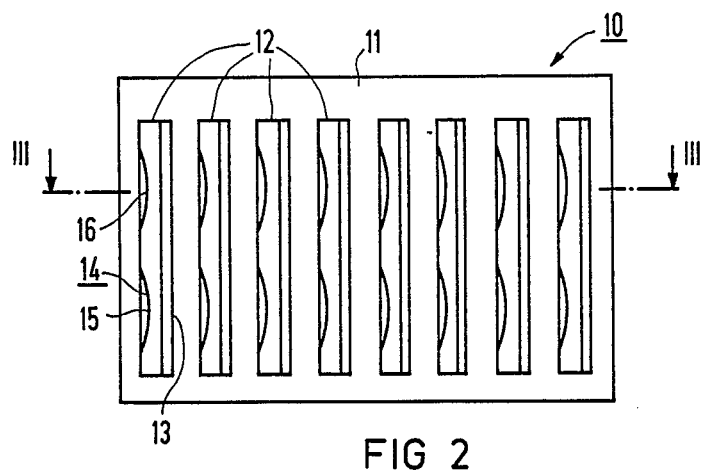
FIG 2
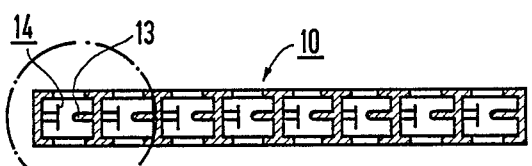
FIG 3
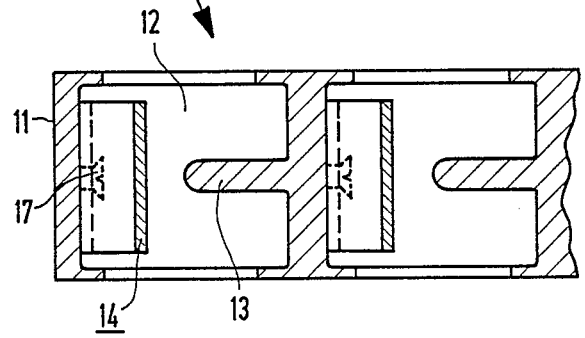

ARRANGEMENT FOR SUPPLYING INTEGRATED COMPONENTS TO AN AUTOMATIC INSERTION MACHINE FOR PRINTED CIRCUIT BOARDS

BACKGROUND OF THE INVENTION

1. Field of the Invention

The invention relates to an arrangement for providing an automatic insertion machine for printed circuit boards with components (e.g., IC's), which are delivered stacked in stick-like magazines and which are conveyable to the automatic insertion machine via a laterally slideable carrier.

2. Description of the Prior Art

The automatic insertion of components into printed circuit boards is known from the state of the art. IC's, particularly those designed as so called DIP-components (dual inline package), supplied stacked in stick-like magazines, are inserted into a carrier which is slideable relative to the admitting port of the automatic insertion machine so that a number of magazines may be processed successively. The insertion capacity is limited thereby by the acceptance ability of the stick magazine, and by the design of the laterally slideable carrier for accepting a series of the stick-like magazines. For technical stocking reasons the stick-like magazines have a length of approximately 50 cm.

In practice, accessibility to the actual automatic insertion machine is complicated by auxiliary conveyor means used for the loading and unloading of the printed circuit boards. For this reason, particularly with the application of robots, such prior art automatic insertion machines had to be shut down in order to replenish the stick-like magazines.

An object of the present invention is, therefore, to provide means for increasing the component insertion capacity of an automatic insertion machine for printed circuit boards in which the components are supplied via stick-like magazines along a laterally slideable carrier device.

SUMMARY OF THE INVENTION

This object is achieved according to the invention, in that a coupling element is provided with which the stick-like magazines mounted in the carrier is coupleable with as well as with an additional set of strip magazines. The coupling element is preferably a preform having a number of passage openings corresponding to the number of stick-like magazines.

In a coupling element of this type, the stick-like magazines may be inserted from either side in such a manner that they make a flush contact with each other. The stacked components can then slide along through the magazines without interference in the same manner as they would if only a single magazine were used.

Through the invention a 100% increase in the insertion capacity is attainable in an advantageous manner. For example, through the invention, shutting down on the facility, in the case of automatic insertion macines with robotic conveyor equipment is not as frequently required, so that a meaningful reduction in cost results. Moreover, the greater weight of the IC's stacked in the magazine leads to fewer interruptions during entry into the machine.

The use of already existing parts, such as a correspondingly modified carrier element, can be employed with the invention. In particular, the base of the carrier is removed for this purpose. Each passage opening in the coupling element is thereby provided with a tongue shaped guiding element for engaging with the stick-like magazine and a counteracting spring. These elements are already available on the carrier element and are thus provided. All parts may, suitably, be made of plastic and are therefore economically producible.

Other features and advantages of the invention will be apparent from the description of the preferred embodiments, and from the claims.

For a fuller understanding of the present invention, reference should now be made to the following detailed description of the preferred embodiments of the invention and to the accompanying drawings.

BRIEF DESCRIPTION OF THE DRAWINGS

FIG. 2 illustrates a side view of the coupling element in FIG. 1; and

FIG. 3 illustrates a top view of a section through FIG. 2 and an associated enlargement of the top view of a single passage opening.

DETAILED DESCRIPTION OF THE PREFERRED EMBODIMENT

Figure 1:
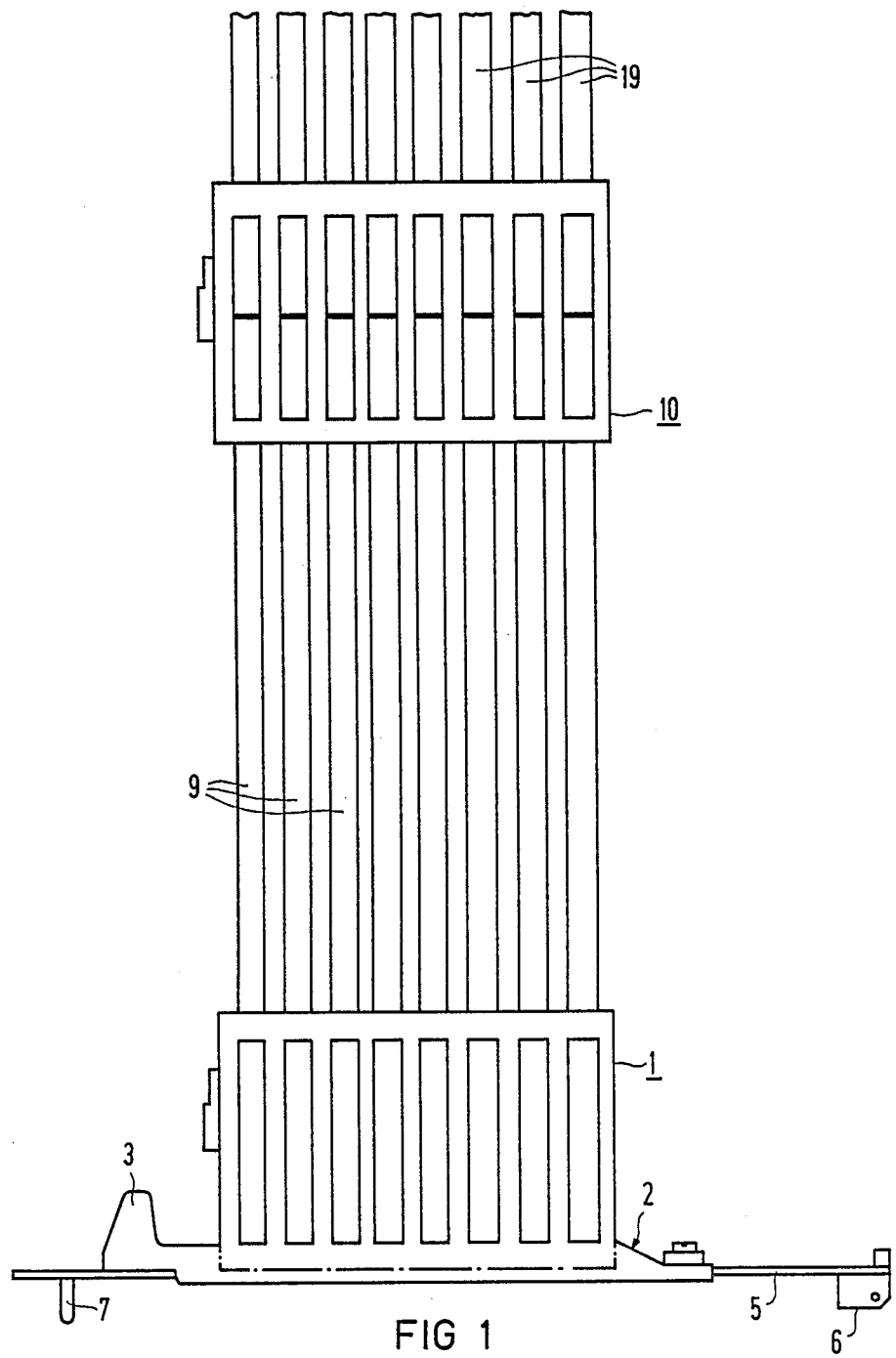
FIG. 1 illustrates a side view of the complete arrangement in accordance with the invention including carrier element and coupling element.

Identical parts in the Figures are given identical reference numbers. The Figures are, in part, described as a unit.

FIG. 1 shows a carrier designated by 1, which is essentially comprised of a base 2, with locking cam 3 and is slideable with its lower supporting base, relative to a blade 5. The blade 5 exhibits a holding device 6 and an engaging stud 7 with which the complete device is attachable to a component automatic insertion machine (not shown).

Eight similar stick-like magazines 9 are inserted into carrier 1. Magazines 9, in which the stacked together IC's are provided by the IC manufacturer, are made of plastic. Magazines 9 are inserted into carrier 1 and pushed forward to a stop by an operator. The supply of IC components provided in magazies 9 may be successively processed through lateral sliding of carrier 1 relative to the automatic insertion machine. When magazines 9 are empty, they are removed with the carrier and replaced with new magazines 9 filled with more components.

In FIG. 1, a coupling element 10, is placed atop the free end of magazines 9 and engaged up to about one half of its height. An additional set of magazines 19 are inserted at the free side of coupling element 10 whereby a single magazine 9 and an additional magazine 19, respectively, are flush and joined together. The height at the point of coupling can thereby vary across the width of the coupling element 10 independently of the exact length of a single lower magazine 9.

In the present case, coupling element 10 allows a 100% increase in the insertion capacity. An important effect on efficiency is achieved thereby.

Coupling element 10 may essentially correspond to the upper section of carrier 1.

As shown in FIGS. 2 and 3, coupling element 10 is comprised of a box-like frame 11 of symmetrical construction in which eight parallel passage openings 12 are provided. Each passage opening 12 on opposite sides exhibits a tongue-shaped guiding element 13 and a compression spring 14. The shape and effect of the guiding tongue 13 and the appertaining counteracting spring 14 may be evident from FIG. 3 and especially from the enlarged sectional drawing portion of FIG. 3.

Via guide 13 and the appertaining counteracting spring 14 an exact guidance results for magazines 9 and/or 19, the cross section of which have an approximately U-shape, for the stacking of the IC's. Through the shape of spring 14 providing two spring bows 15 and 16, two magazines 9 and 19, particularly in butting together, can be so guided that they join without offset edges, and a trouble-free sliding passage of the IC's is assured. Inasmuch as more IC's are now stacked, there is a greater weight upon the IC's during insertion and a reduction in interruptions during the supply of the automatic insertion machine.

Thus, there has been shown and described novel apparatus for coupling together magazines of components which are introduced into an automatic insertion machine via a slideable carrier which fulfills all the objects and advantages sought therefore. Many changes, modifications, variations and other uses and applications of the subject invention will, however, become apparent to those skilled in the art after considering this specification and the accompanying drawings which disclose a preferred embodiment thereof. For example, all individual parts of the coupling element 10, particularly the box element 11, the guide element 13 and the spring 14 may be made of a suitable plastic. The tongue shaped guide 13 may be an integral part of the frame element 11. The engaging element for the spring 14 may be formed by a plastic nipple 17. All such changes, modifications, variations and other uses and applications which do not depart from the spirit and scope of the invention are deemed to be covered by the invention which is limited only by the claims which follow.

What I claim is:

1. An arrangement for supplying components to an automatic insertion machine for insertion into printed circuit boards, which components are supplied stacked in a plurality of stick-shaped magazines having one end introduced into the automatic insertion machine via a laterally slideable carrier device, comprising:

a coupling element for coupling an additional corresponding plurality of stick-shaped magazines to the other ends of said first-mentioned plurality of stick-shaped magazines which were introduced into said carrier said coupling element being a preform having a plurality of passage openings corresopnding to the plurality of stick-shaped magazines introduced into said carrier, wherein each passage opening in said coupling element has a tongue shaped guiding element and a counteracting spring for engaging each of said pluralities of stick-shaped magazines, wherein said guiding element and counteracting spring acting upon the respective ends of said magazines are coupled together via said coupling element so that a flush joining of the respective ends of the pluralities of said magazines results in the passage openings of said coupling element.

2. An arrangement according to claim 1, wherein:

said coupling element, guiding elements and said appertaining counteracting springs are all made of plastic.

* * * * *